(12) United States Patent
Parent

(10) Patent No.: US 7,813,209 B2
(45) Date of Patent: Oct. 12, 2010

(54) METHOD FOR REDUCING POWER CONSUMPTION IN A VOLATILE MEMORY AND RELATED DEVICE

(75) Inventor: Richard Michael Parent, Shelburne, VT (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 106 days.

(21) Appl. No.: 12/243,944

(22) Filed: Oct. 1, 2008

(65) Prior Publication Data

US 2010/0080070 A1 Apr. 1, 2010

(51) Int. Cl.
*G11C 5/14* (2006.01)
*G11C 7/00* (2006.01)

(52) U.S. Cl. .................. 365/227; 365/201; 365/226
(58) Field of Classification Search .......... 365/227
See application file for complete search history.

(56) References Cited

U.S. PATENT DOCUMENTS

| | | | | |
|---|---|---|---|---|
| 5,594,701 A * | 1/1997 | Asaka et al. | ......... | 365/230.03 |
| 5,689,469 A * | 11/1997 | Asaka et al. | ......... | 365/203 |
| 5,894,440 A * | 4/1999 | Tsukude et al. | ......... | 365/190 |
| 6,144,599 A * | 11/2000 | Akita et al. | ......... | 365/203 |
| 6,301,173 B2 * | 10/2001 | Fujioka et al. | ......... | 365/203 |
| 6,850,454 B2 * | 2/2005 | Kuge et al. | ......... | 365/227 |
| 7,366,047 B2 * | 4/2008 | Bowyer et al. | ......... | 365/222 |
| 7,630,260 B2 * | 12/2009 | Kobayashi | ......... | 365/203 |
| 7,660,184 B2 * | 2/2010 | Kobayashi | ......... | 365/230.03 |
| 2007/0104005 A1 * | 5/2007 | Bowyer et al. | ......... | 365/207 |

* cited by examiner

*Primary Examiner*—Son L Mai
(74) *Attorney, Agent, or Firm*—Winston Hsu; Scott Margo; Min-Lee Teng

(57) ABSTRACT

A method for reducing power consumption in a volatile memory includes switching off a bitline voltage provider according to a leakage control signal when a bitline array corresponding to the bitline voltage provider is dysfunctional due to a wordline to bitline short, controlling connections between a plurality of first bitline arrays corresponding to the bitline voltage provider and a plurality of sense amplifiers according to an access control signal, controlling connections between a plurality of second bitline arrays corresponding to the plurality of first bitline arrays and the plurality of sense amplifiers according to the access control signal, and providing power to the plurality of corresponding sense amplifiers according to the access control signal.

14 Claims, 11 Drawing Sheets

METHOD FOR REDUCING POWER CONSUMPTION IN A VOLATILE MEMORY AND RELATED DEVICE

BACKGROUND OF THE INVENTION

1. Field of the Invention

The present invention relates to a method for reducing power consumption in a volatile memory and related device, and more particularly, to a method and related device for eliminating DC current due to wordline to bitline short in the volatile memory operating in a standby mode.

2. Description of the Prior Art

Low power DRAM (dynamic random access memory) design plays an important role in modern electronic devices. There are numerous benefits for using low power designs: battery time can last longer to improve device portability, less energy spending can save cost and conserve natural resources, etc. In a DRAM, standby current is a current level consumed by the DRAM in a standby state (or quiescent state). According to JEDEC, the Joint Electronic Device Engineering Council, for example, an upper limit of the standby current (Idd6) should be in the range of 500 uA, which has become a highly challenging design task. Among numerous factors obstructing the way to meet low power specifications, wordline to bitline (WL2BL) short, which is also known as cross-fail, is a common defect in DRAM manufacturing process which draws a large portion of DC leakage current. The internal mechanism of leakage current induced by WL2BL short is closely related to the architecture and the memory access functions of the DRAM. The memory refresh, memory read, or memory write procedures in DRAM device can be initiated with a memory refresh command, a memory read command or a memory write command, respectively. The executions of these commands start with a selected wordline with voltage VWL being driven on to ON state voltage (VPP) produced by a built-in charge pump circuit on the memory device, the data transistors corresponding to the wordline are switched on altogether and the charges in the selected memory cell capacitors are then transferred onto the bitlines. Please refer to FIG. 1, which illustrates a bitline array structure 10 of a DRAM. The bitline array structure 10 comprises a first bitline array 100, a sense amplifier 102, a second bitline array 104, a first bitline equalizing circuit 106, a second bitline equalizing circuit 108, a sense node activation circuit 110, a first multiplexer 112, a second multiplexer 114 and bitline voltage providers MEQ1, MEQ2. The first and second bitline equalizing circuits 106, 108 coupled to the bitline voltage providers MEQ1, MEQ2 are used to supply equalized voltages to bitlines of the bitline arrays 100, 104. VEQLG is a global signal used to switch the bitline voltage providers MEQ1, MEQ2, and with VEQLG signal high, the equalizing voltage VBLEQ is made to supply to every bitlines in the DRAM. For clearly explaining the operations of the bitline arrays 100, 104 and the sense amplifier 102, please refer to FIG. 2. FIG. 2 illustrates an implementation of the bitline array structure 10 shown in FIG. 1 according to the prior art. The circuit components in the first bitline array 100, the sense amplifier 102, the first bitline equalizing circuit 106, and the sense node activation circuit 110 are shown together for clear explanation. The first bitline array 100 comprises an example memory cell transistor M1 and a memory cell capacitor C1. First, the bitline of the first bitline array 100 has been precharged to a mid-level of voltage named bitline equalizing voltage (VBLEQ). When the wordline with on state voltage switches on the memory cell transistor M1, the charges from the memory cell capacitor C1 will generate small voltage differences on the bitline of the first bitline array 100. The small voltage perturbation deviated from the equalizing voltage VBLEQ makes bitline's voltage level moved somewhat positively or negatively from VBLEQ, and the small voltage deviation is magnified by the sense amplifier 102. The sense amplifier 102 comprises an n-latch composed of two NMOS transistors MN1, MN2, and a p-latch composed of two PMOS transistors MP1, MP2. The sense amplifier 102 is designed to work as a bi-stable memory device whose initial state is a mid-level voltage (VBLEQ) and the final stabilized state is either a high voltage state or a low voltage state, depending on the voltage of the bitline. The function of the sense amplifier 102 is also controlled by the sense node activation circuit 110, which is used to activate the sense amplifier 102. The sense node activation circuit 110, composed of NMOS transistors MAN1 to MAN5, and PMOS transistor MAP1, is designed to activate the sense amplifier 102 after the memory cell capacitor C1 is switched on and the charges in the capacitor C1 starts affecting the voltage level of the bitline of the first bitline array 100. The sense node activation circuit 110 will help the sense amplifier 102 to amplify the small deviation of the bitline's voltage to become one of two final states. In case of the operation of a memory refresh command, the final state of the sense amplifier 102 are written back to the original memory cell capacitor C1, and the wordline voltage dropped back to the off state voltage (VNWL) to complete the memory refresh command. The memory read command differs from the memory refresh command by further transferring the final state of the sense amplifier 102 to the external circuitry. The memory write command applies an external voltage to overwrite the state in the sense amplifier 102 as well as the memory cell capacitor C1.

Please refer to FIG. 3, which illustrates the bitline array structure 10 with a WL2BL short defect. The WL2BL short defect refers to a wordline WL and a bitline array (the first bitline array 100 in this example) exhibits a finite electrical resistance RS between the wordline and the bitline array owing to manufacturing fault. The defect is usually a very small electrical resistive short between the bitline contact and the wordline poly via the sidewall spacer. The existence of WL2BL short increases the operating power of the DRAM chip owing to extra leakage current.

According to the experiment, while operating in the standby mode, the WL2BL short defect will draw leakage currents from the voltage VBLEQ to the voltage VNWL (wordline off state voltage). Please refer to FIG. 4A to FIG. 4C. FIG. 4A to FIG. 4C illustrate circuit diagrams showing three different leakage paths from VBLEQ to VNWL which are marked with dashed arrow lines:

Path 1, via the bitline voltage provider MEQ1 corresponding to the bitline equalizing circuit 106 of the defect bitline array 100 to the wordline WL with off-state voltage;

Path 2, via the sense node activation circuit 110 through the n-latch transistors MN1, MN2 of the sense amplifier 102 to the wordline WL with off-state voltage; and Path 3, via the sense node activation circuit 110 through the p-latch transistors MP1, MP2 of the sense amplifier 102 to the wordline WL with off-state voltage.

According to the prior art, for DRAM with WL2BL short defect and in the standby state, the bitline voltage provider MEQ1 remains on. Because the gate terminal of the bitline voltage provider MEQ1 is connected to the global signal VEQLG, and according to the prior art, there is no way to switch off a specific MEQ1 to stop the leakage current via Path 1. Meanwhile, according to the prior art, there is no way to stop the leakage current via Path 2 and Path 3, because the multiplexers 112, 114 are switched on during the standby state. Since the multiplexers 112, 114 are controlled by global signals VMUX1 and VMUX2, respectively, there is no way to solely turn off any specific multiplexer. For example, if the WL2BL defect happens in the first bitline 100, the gate of the bitline voltage provider MEQ1 is connected to the global signal VEQLG, the gates of transistors (MUXN1, MUXN2) of the first multiplexer 112 are connected to the global control signal VMUX1, and can't be switched off during standby state. All three leakage paths (Path 1, Path 2 and Path 3) remain conducting for leakage current.

Furthermore, since the wordline off-state voltage (VNWL) is generated by an on-chip charge pump circuit. The inherent inefficiency of the charge pump circuit in the wordline circuit magnifies the leakage current, and adds substantial current level to the external voltage source. According to the prior art, while no adequate measures are available for reducing the leakage current both in the standby mode, the leakage current resulting from WL2BL short defect of DRAM is too large to be accepted and the upper limits set for Idd6 could be unwillingly surpassed.

SUMMARY OF THE INVENTION

It is therefore a primary objective of the claimed invention to provide a method for reducing power consumption in a volatile memory.

The present invention discloses a method for reducing power consumption in a volatile memory, which comprises switching off a first voltage provider according to a first local control signal when a bitline array corresponding to the first voltage provider is dysfunctional due to a wordline to bitline short, controlling connections between a plurality of first bitline arrays corresponding to the first voltage provider and a plurality of sense amplifiers according to a first global control signal, controlling connections between a plurality of second bitline arrays corresponding to the plurality of first bitline arrays and the plurality of sense amplifiers according to the global control signal, and providing power to the plurality of corresponding sense amplifiers according to the first global control signal.

The present invention discloses a leakage control device for reducing power consumption in a volatile memory, which comprises a local leakage controller for switching off a first voltage provider according to a first local control signal when a bitline array corresponding to the first voltage provider is dysfunctional due to a wordline to bitline short, a first multiplexer controller for controlling connections between a plurality of first bitline arrays corresponding to the first voltage provider and a plurality of sense amplifiers according to a first global control signal, a second multiplexer controller for controlling connections between a plurality of second bitline arrays corresponding to the plurality of first bitline arrays and the plurality of sense amplifiers according to the first global control signal, a plurality of sense voltage providers for providing power to the plurality of corresponding sense amplifiers according to the first global control signal, and a control signal generator for generating the first global control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
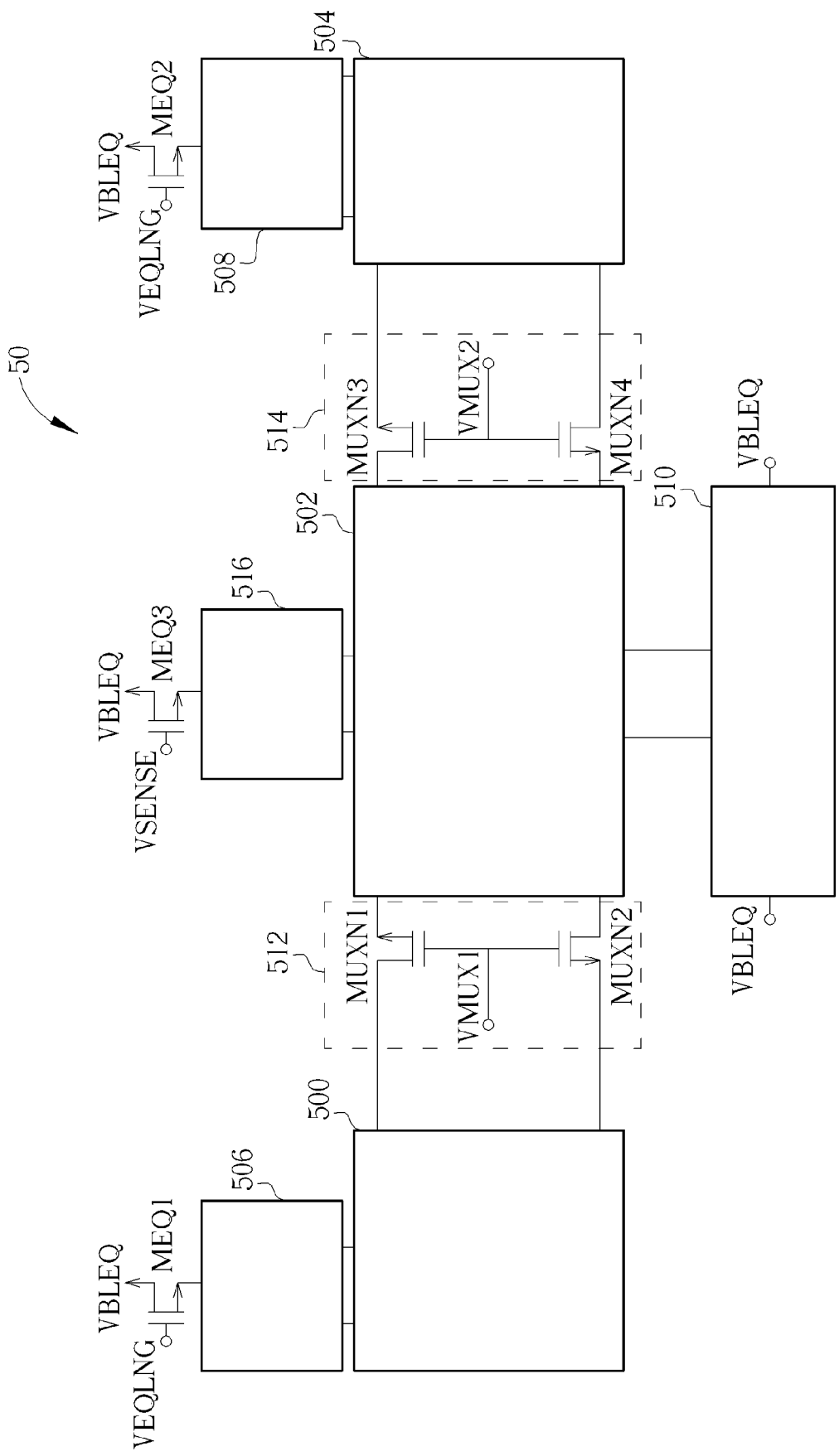
FIG. 5 illustrates a bitline array structure in accordance with an embodiment of the present invention.

Please refer to FIG. 5, which illustrates a bitline array structure 50 in accordance with an embodiment of the present invention. The bitline structure 50 can reduce power consumption in a volatile memory, such as DRAM, and comprises a first bitline array 500, a sense amplifier 502, a second bitline array 504, a first bitline equalizing circuit 506, a second bitline equalizing circuit 508, a sense node activation circuit 510, a first multiplexer 512, a second multiplexer 514, a third bitline equalizing circuit 516, and bitline voltage providers MEQ1, MEQ2, and a sense voltage controller MEQ3. The bitline voltage providers MEQ1 and MEG2 are controlled by a signal VEQLNG, and are used as switches for controlling the supplies of equalizing voltage to the first bitline array 500 and the second bitline array 504. MEQ3 is controlled by a signal VSENSE, and is a switch for controlling the supply of equalizing voltage to the sense amplifier 502. In the bitline array structure 50, when a wordline WL is selected corresponding to the first bitline array 500, the first multiplexer 512 is switched on, so that the sense amplifier 502 can sense and amplify voltage deviation on the first bitline array 500. In this case, the second multiplexer 514 remains off and voltage of the second bitline array 504 stay equalized. Similarly, when a wordline WL is selected corresponding to the second bitline array 504, the second multiplexer 514 is switched on, such that the sense amplifier 502 can sense and amplify voltage deviation on the second bitline array 504. In this case, the first multiplexer 512 remains off and voltage of first bitline array 500 stay equalized. Meanwhile, the equalizing circuit 516 of the sense amplifier is switched off by the control signal VSENSE before the sense amplifier is activated by the sense node activation circuit 510 to sense and amplify bitline signals.

In the present invention, the first multiplexer 512 and the second multiplexer 514 are switched off during standby state. To switch off the first multiplexer 512 and the second multiplexer 514 will isolate the signal or voltage connections between the sense amplifier 502 and the first bitline array 500 and between the sense amplifier 502 and the second bitline array 504. In order to keep the voltage of the sense amplifier 502 at the equalized value during standby state, the third equalizing circuit 516 is added to provide equalizing voltage to the sense amplifier 502. Therefore, by using the bitline array structure 50 and its associated control method, the memory access command can be properly executed.

Figure 6:
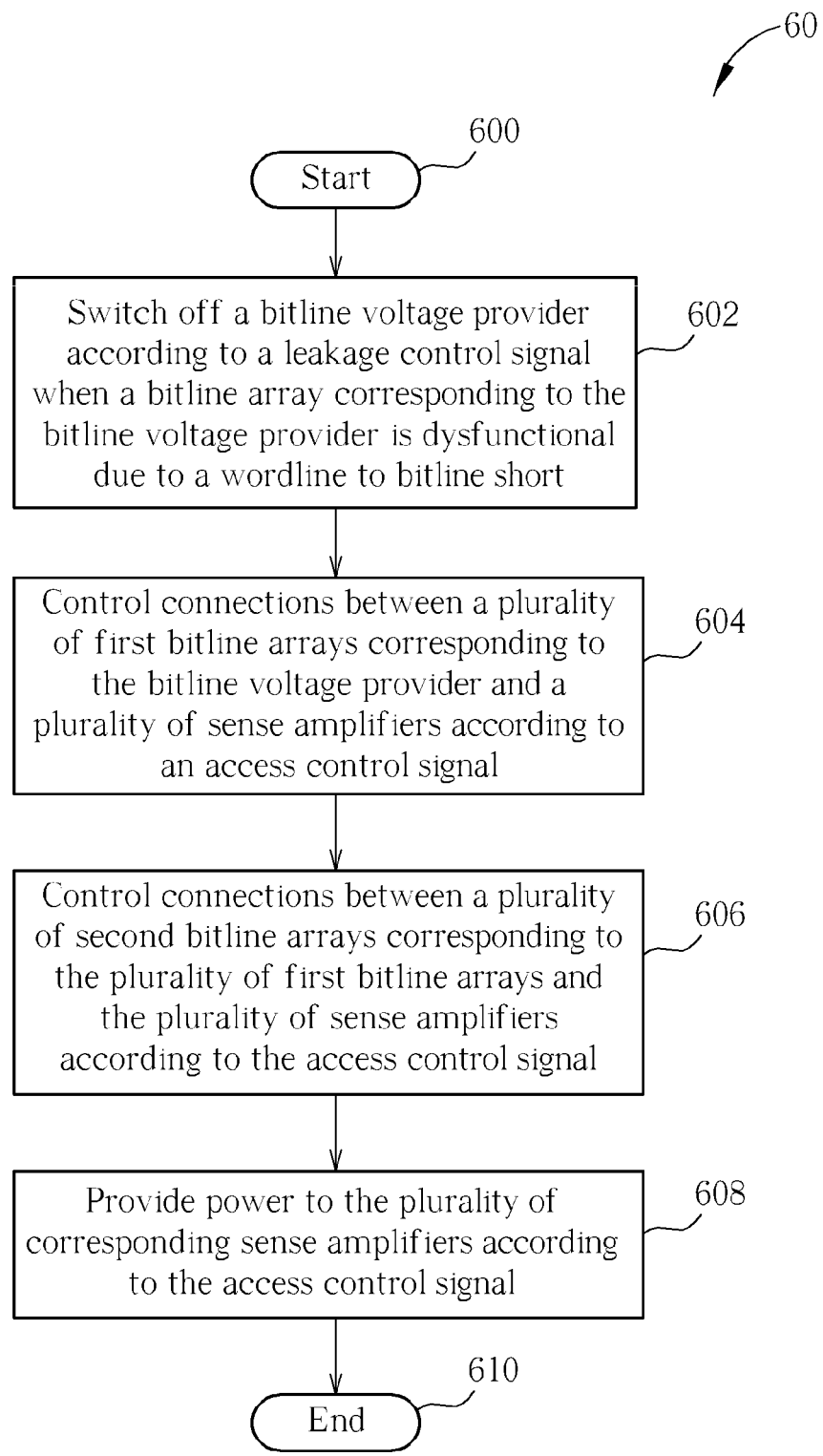
FIG. 6 is a schematic diagram of a leakage control flowchart in accordance with an embodiment of the present invention.

Furthermore, for eliminating the leakage current of a WL2BL short defect in standby state, please refer to FIG. 6. FIG. 6 is a schematic diagram of a leakage control flowchart 60 in accordance with an embodiment of the present invention. The leakage control flowchart 60 comprises the following steps:

STEP 600: Start.

STEP 602: Switch off a bitline voltage provider according to a leakage control signal when a bitline array corresponding to the bitline voltage provider is dysfunctional due to a wordline to bitline short.

STEP 604: Control connections between a plurality of first bitline arrays corresponding to the bitline voltage provider and a plurality of sense amplifiers according to an access control signal.

STEP 606: Control connections between a plurality of second bitline arrays corresponding to the plurality of first bitline arrays and the plurality of sense amplifiers according to the access control signal.

STEP 608: Provide power to the plurality of corresponding sense amplifiers according to the access control signal.

STEP 610: End.

According to the leakage control flowchart 60, while a WL2BL defect has been detected, the leakage control signal is generated by a detecting process when the detecting process identifies a WL2BL short. Preferably, the detecting process is performed during the test process of the memory device right after the manufacturing process is completed. Preferably, the bitline voltage provider will be switched off permanently by fuse after the detecting process identifies a WL2BL short belonging to a specific bitline voltage provider, and the leakage current via the Path 1 can be eliminated.

Furthermore, disabling the connections between the bitlines 500, 504 and the corresponding sense amplifier 502 can eliminate the leakage current via the leakage Path 2 and Path 3 while standby. According to the present invention, the connections between the bitlines 500, 504 and the associated sense amplifier 502 are enabled only when a memory access command is executed. An access control signal is used for controlling the connections between the bitlines 500, 504 and their corresponding sense amplifier 502. When the memory access command is issued for execution, the connections between the bitlines 500, 504 and the associated sense amplifier 502 are enabled, otherwise the connections are disabled, such that the leakage current via path 2 and 3 can be eliminated in the standby mode, and can be minimized overall. According to the present invention, the multiplexers 512, 514 can be used to control the connections between the bitline arrays 500, 504 and the sense amplifier 502.

Also, in the present invention, an access control signal generator is used to generate access control signals to control the operations of the memory device according to the memory access command and other conditions. Using the access control signals to disable or enable the connections between the bitlines 500, 504 and the sense amplifier 502, the present invention can eliminate the leakage current via path 2 and path 3 during the standby state. Also, while the connection between a specific bitline array and the sense amplifier is enabled for memory access, the access control signal is also used for switching off the equalizing voltage provider 516 of the sense amplifier 502.

Preferably, the above-mentioned memory access command can be memory read command, memory write command, and memory refresh command. The access control signals, generated by an access control signal generator, comprises a VSENSE signal to control the sense voltage provider of the sense amplifier. The VMUX1 signal, generated by a first multiplexer controller to control the first multiplexer. The VMUX2 signal, generated by a second multiplexer controller to control the second multiplexer. And, The leakage control signal generated by a local leakage controller for switching off a bitline voltage provider owing to WL2BL short defect. The access control signal generator, the first multiplexer controller, the second multiplexer controller, local leakage controller and the sense voltage provider jointly constitute the leakage control device according to the present invention.

Figure 7:
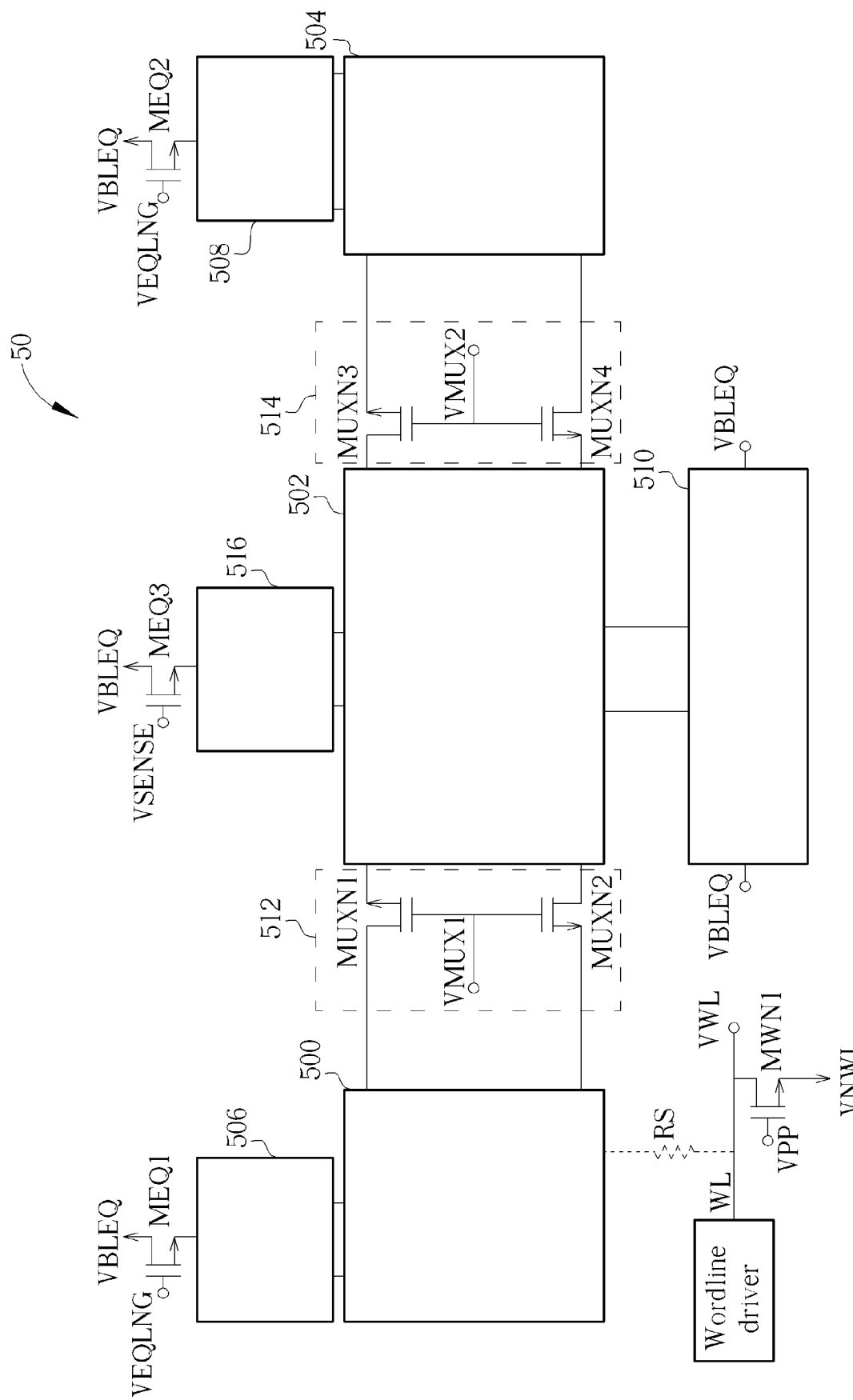
FIG. 7 illustrates a schematic diagram of the bitline array structure with a WL2BL short defect.

Please also refer to FIG. 7, which illustrates a schematic diagram of the bitline array structure 50 with a WL2BL short defect. As mentioned above, the memory access command can be properly executed based upon the bitline structure 50. In the bitline array structure 50, the first and second multiplexers 512, 514 are both switched off to isolate any of the cross-fail leakage current. Each segment has its proprietary equalizing circuits 506, 516, 508 to maintain the proper standby voltage. Therefore, even if the first multiplexer 512 and the second multiplexer 514 are switched off, voltage of the sense amplifier 502 can still be equalized by the proprietary equalizing circuit 516. When a wordline WL is selected corresponding to the first bitline array 500, only the first multiplexer 512 is turned on and the sense amplifier 502 is ready to sense and amplify. The same situation is valid for the second array 504. When a wordline WL is selected corresponding to the second array 504, only the second multiplexer 514 is turned on and the sense amplifier 502 is ready to sense and amplify.

Figure 1:
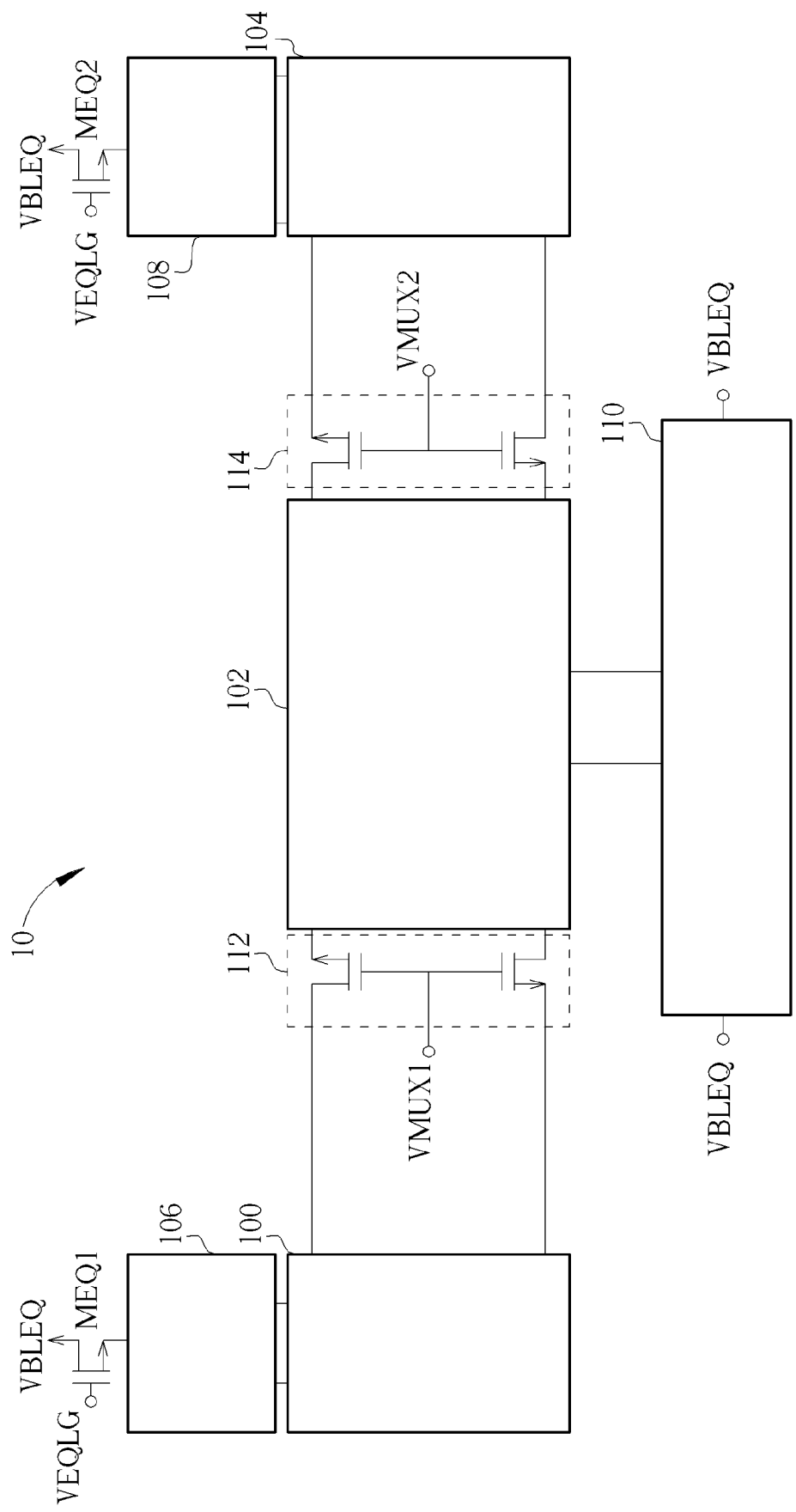
FIG. 1 illustrates a bitline array structure of a DRAM.
Figure 2:
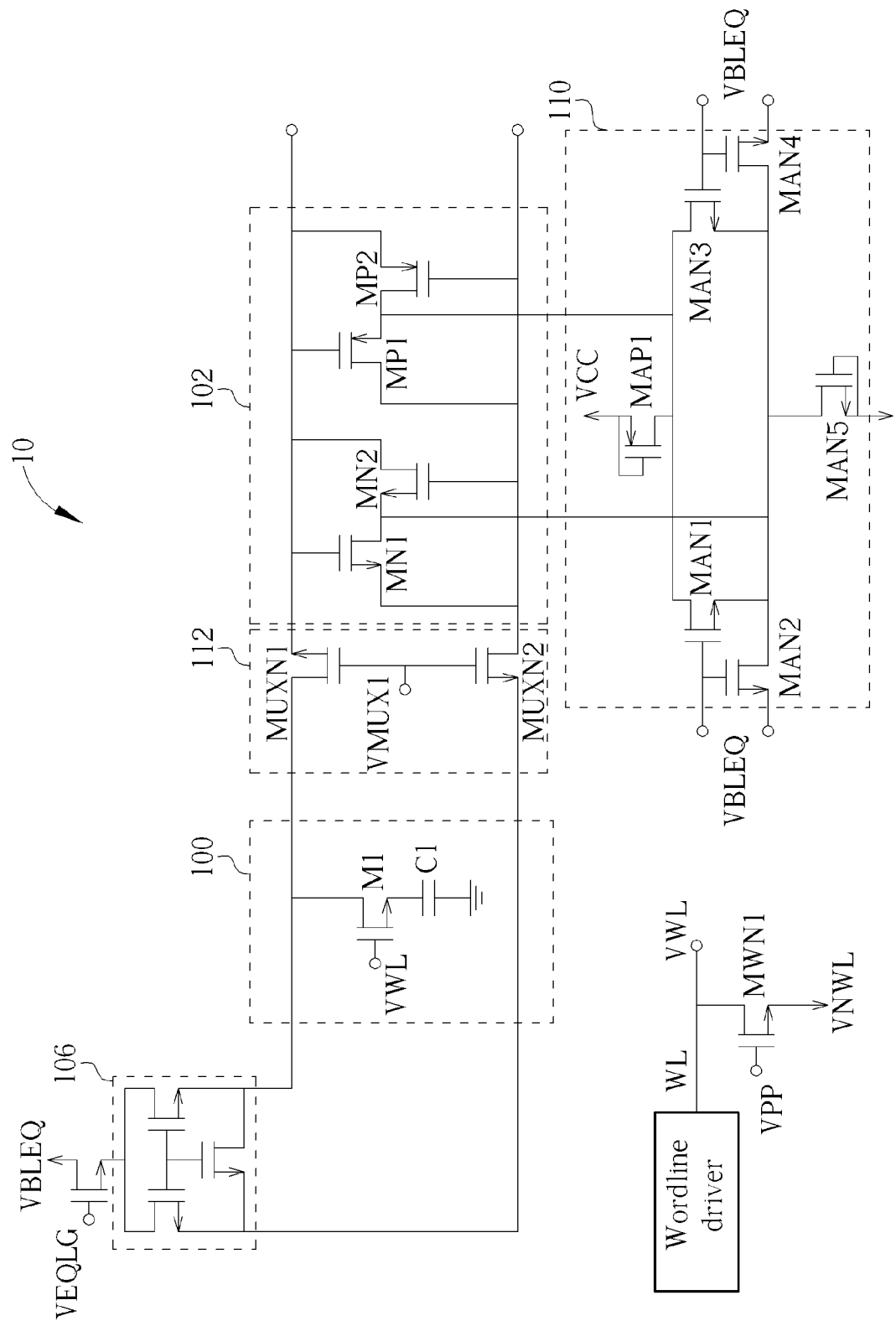
FIG. 2 illustrates an implementation of the bitline array structure shown in FIG. 1 according to the prior art.
Figure 3:
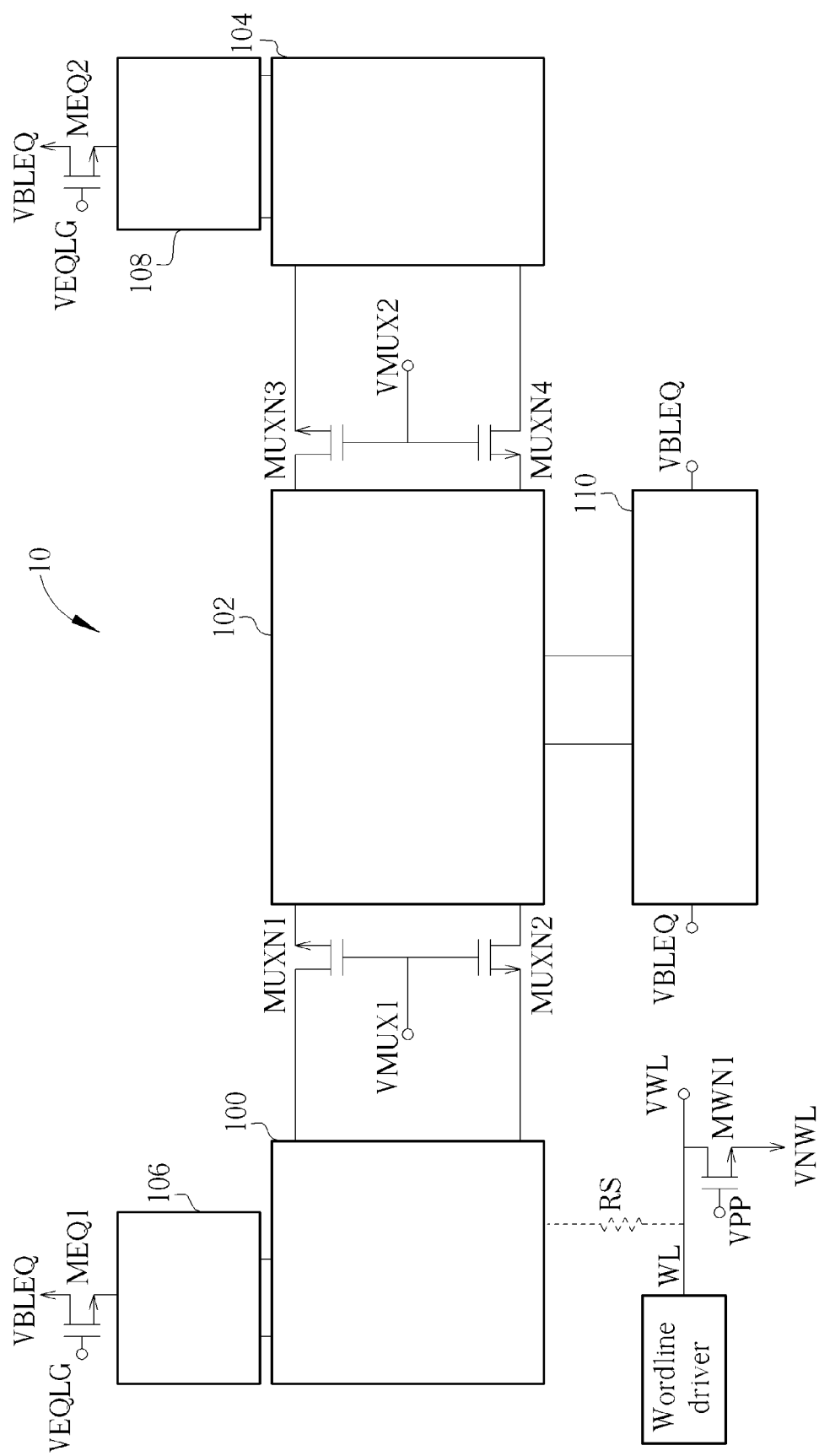
FIG. 3 illustrates the bitline array structure shown in FIG. 1 with a WL2BL short defect.
Figure 4A:
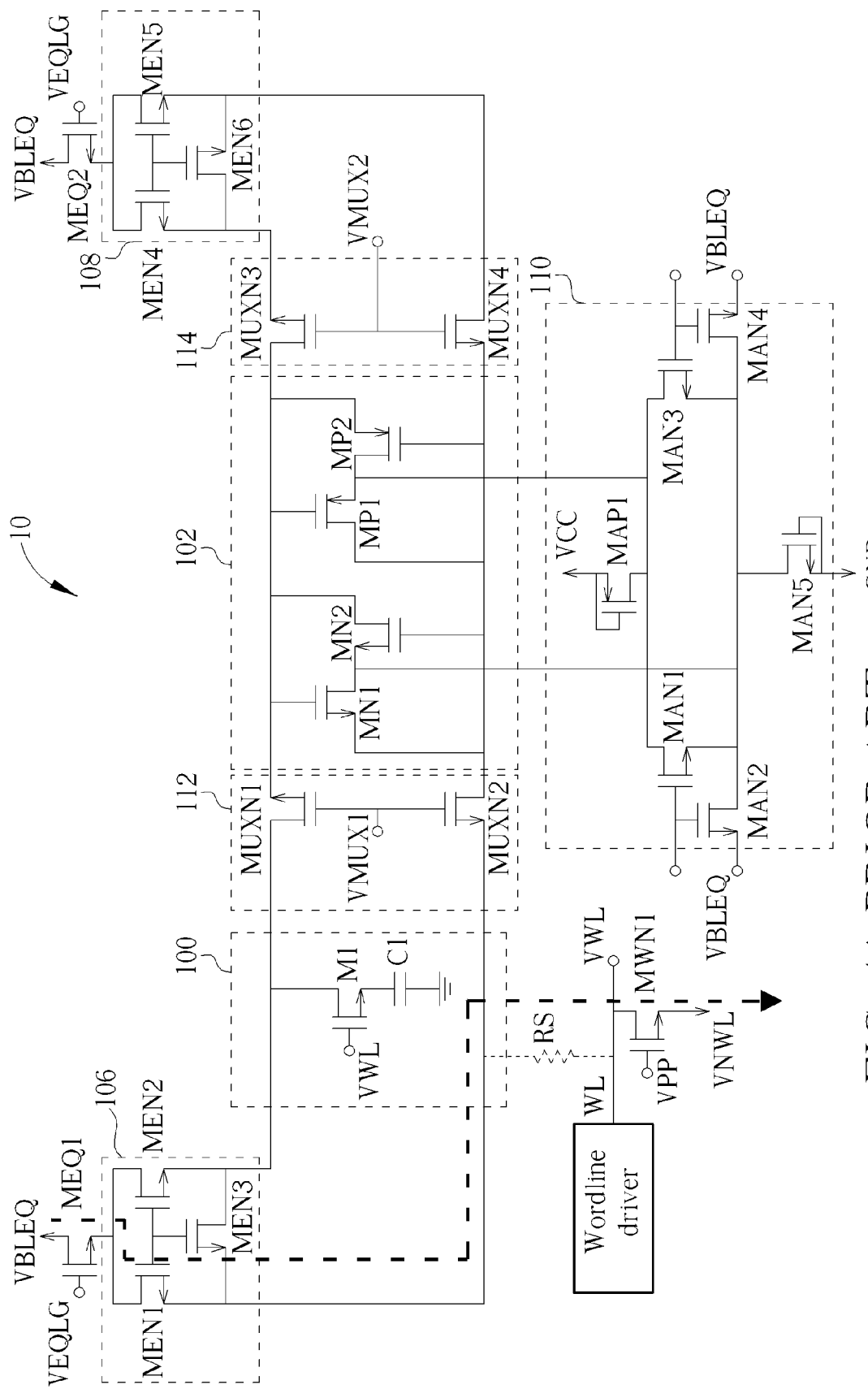
FIG. 4A to FIG. 4C illustrate circuit diagrams showing three different leakage paths from VBLEQ to VNWL which are marked with dash lines.
Figure 4B:
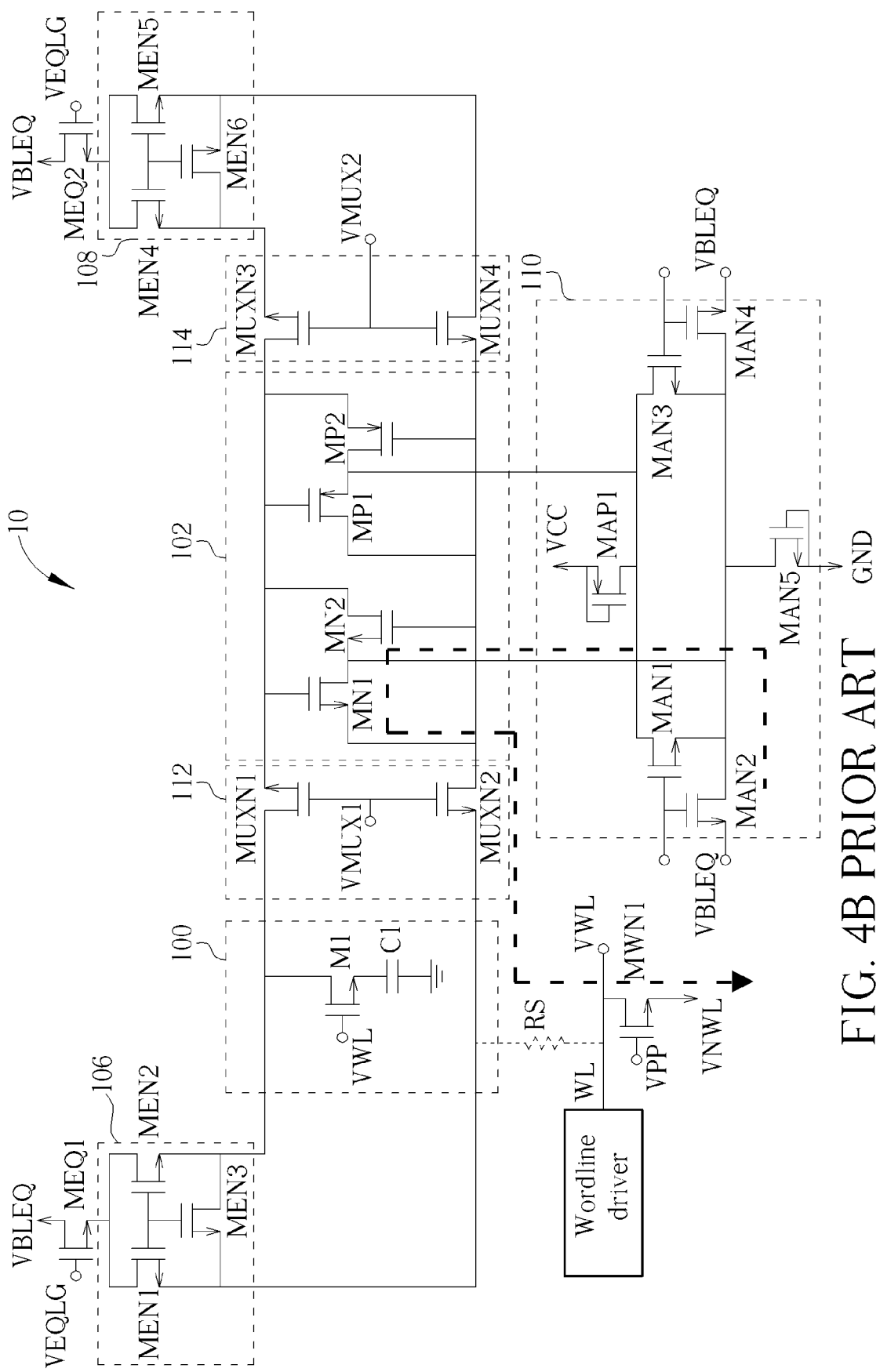
Figure 4C:
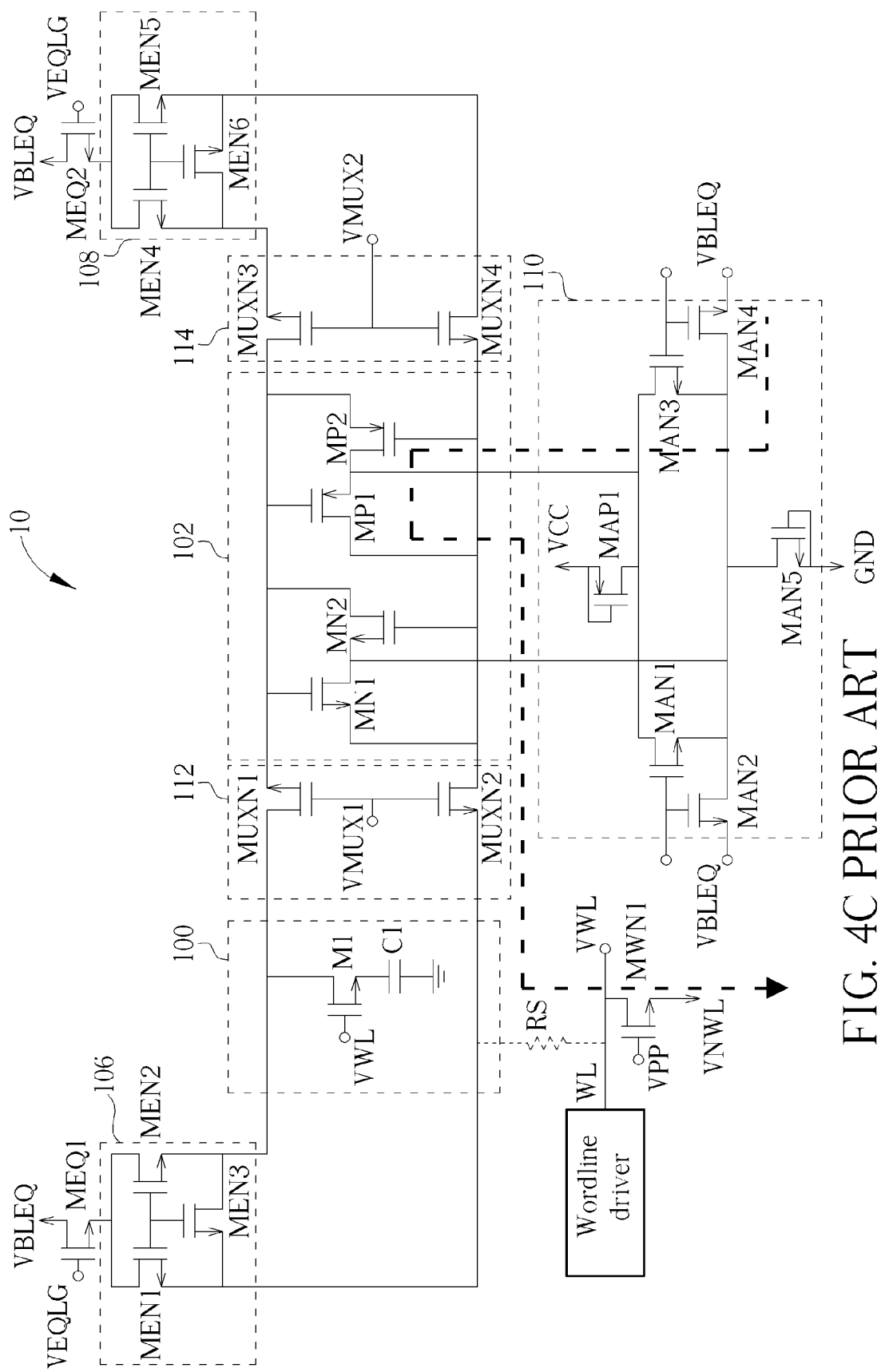

In the present invention, the first and second multiplexers 512, 514 are both switched off to isolate any of the cross-fail leakage current. This is in contrast to the prior art bitline array structure 10 shown in FIG. 1. In the prior art, the multiplexers 112, 114 are all switched on during the standby state such that the equalizing voltage can be distributed to the first array 100, the sense amplifier 102 and the second array 104. And, the multiplexers 112, 114 will provide the leakage paths for the leakage current when a WL2BL short exists.

Noteworthily, when a WL2BL short has been detected, the leakage current flowing in Path 1 can be eliminated by switching off the bitline voltage provider. In the present invention, once a WL2BL short is identified, the defective part is excluded from data access by switching off bitline voltage provider for good. Furthermore, the memory cells in the entire region, named column select line, and associated bitlines will be replaced by spare, or redundant column select lines. Therefore, not only the whole bitline will be replaced, but the sense amplifier 502 and the associated control circuit belongs to the defective bitline will also be replaced. By this method, the leakage current via Path 1 can be cut off. For non-defective parts of the memory chip, the gate should remain in the on state. In the present invention, the controlling gate voltages for the bitline voltage provider will be preferably generated in pitch circuitry parallel to the bitline direction and shipped via upper metal levels to the associated NMOS of the bitline voltage provider.

Figure 8:
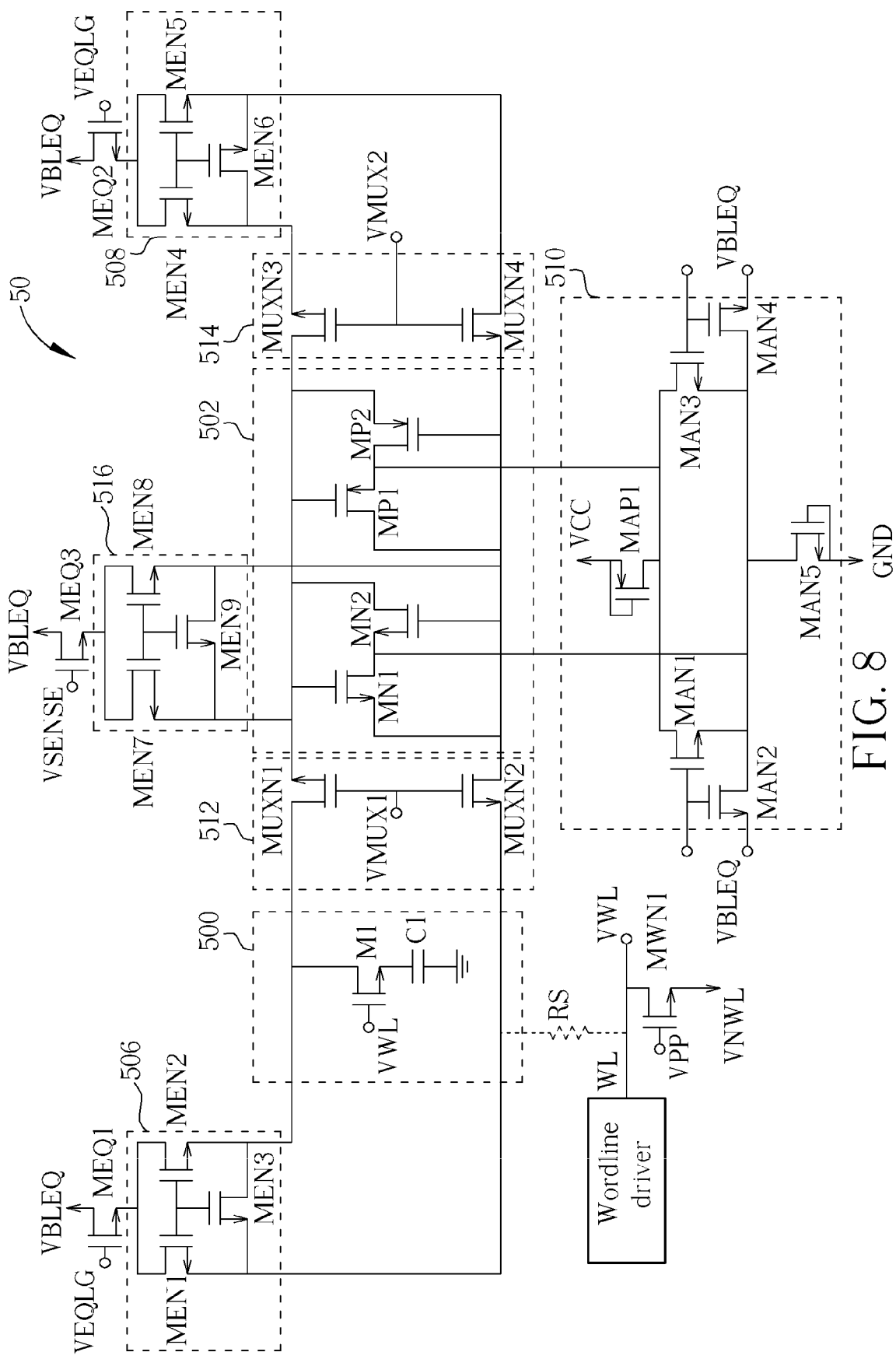
FIG. 8 illustrates an implementation in accordance with an embodiment of the present invention.

Please refer to FIG. 8, which illustrates an implementation in accordance with an embodiment of the present invention. The equalizing circuit coupled to the sense amplifier comprises transistors MEN7, MEN8 and MEN9, and a sense voltage controller MEQ3. The rest of the components is adopted from the bitline array structure 10. An access control signal generator (not shown in FIG. 8) generating access control signals VSENSE, VMUX1, VMUX2 for controlling the components is integrated with the system controller of the memory device.

Figure 9:
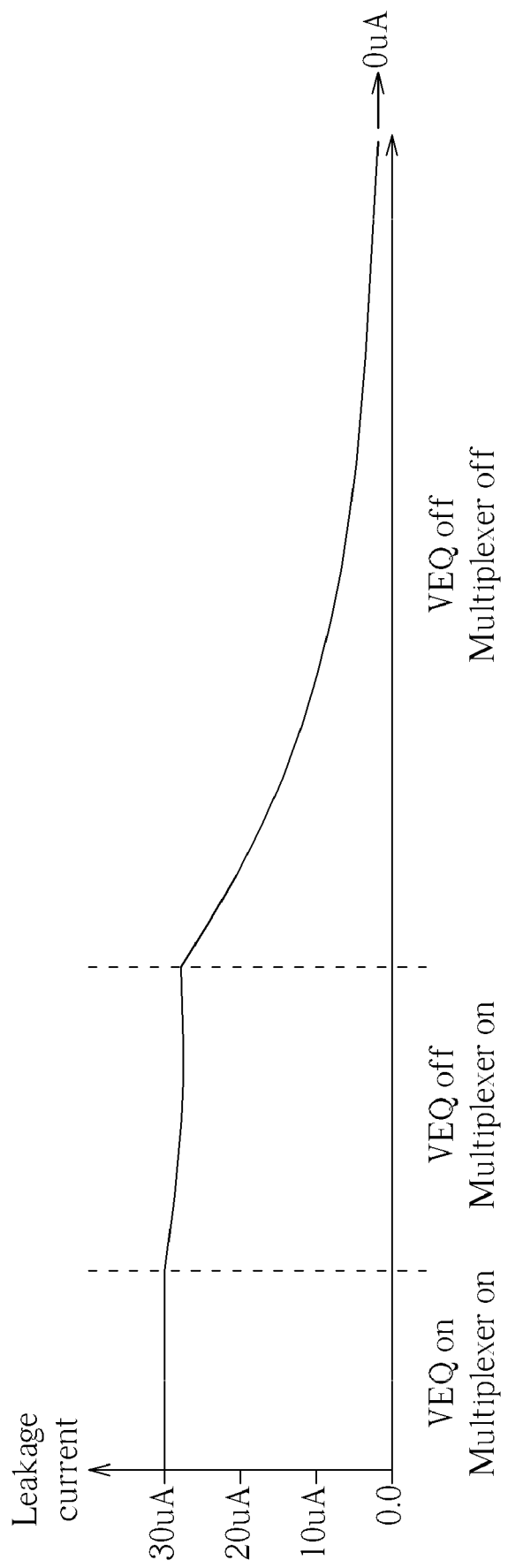
FIG. 9 illustrates a schematic diagram of the leakage current level under three different conditions.

Please refer to FIG. 9, which illustrates a schematic diagram of the leakage current level under three different conditions in the bitline array structure 50. The leakage current shows the benefits presented in the present invention. First, the current is at 30 microamperes, and a level with both the bitline voltage provider and the multiplexer is switched on. Second, the current is reduced by a few microamperes by switching off the bitline voltage provider only. Third, the leakage current drops significantly and eventually approaches to 0 microamperes, by switching off both the multiplexer and the bitline voltage provider together.

In the present invention, to reduce the leakage current via Path 2 and Path 3, the first multiplexer 512 and the second multiplexer 514 which connect the sense amplifier 502 and the first bitline arrays 500, 504 must be switched off in standby mode. For executing memory access command, the first multiplexer 512 and the second multiplexer 514 behave as the isolation devices to control the connections between the bitline arrays and the sense amplifiers. According to the present invention, by introducing this control mechanism into the bitline structure 50, the leakage current in standby state can be eliminated to a satisfactory level, and the normal memory access command can be properly executed.

To make a summary, the defective part will be decoupled from the DRAM voltage network by turning off the switch of the bitline equalizing circuit. First, for a WL2BL short, the bitline voltage provider is shut off (voltage driven to VNWL), and for non-defective part, the gate voltage of bitline voltage provider remains on. In the defective case, the whole region will be replaced by redundancy. Second, a proprietary equalizing circuit is added to sense amplifier. The normal function of the sense amplifier can be assured by keeping the sense amplifier at equalized value when multiplexers are all switched off. Also in the normal operation, when the wordline in the first bitline array is selected, the first multiplexer is switched on, and the bitline voltage provider in the sense amplifier is switched off. The second multiplexer stays off. When the wordline in the second array is selected, the second multiplexer is switched on, and the bitline voltage provider in the sense amplifier is switched off. The first multiplexer stays off. In the standby mode, both the first multiplexer and the second multiplexer are switched off. Compared with the prior art, the present invention adds an extra equalizing circuit to keep the sense amplifier at the equalized voltage level.

Those skilled in the art will readily observe that numerous modifications and alterations of the device and method may be made while retaining the teachings of the invention.

What is claimed is:

1. A method for reducing power consumption in a volatile memory having bit line arrays selectively operational in a memory standby state and a memory access state, power suppliers each coupled to a corresponding one of the bit line arrays for providing power to the bit line arrays, and a sense amplifier coupled to the bit line arrays, the method comprising the steps of:

deactivating connections between the bitline arrays and the sense amplifiers in the memory standby state;

deactivating power supply from one of the power suppliers when one of the bit line arrays corresponding to the one of the power suppliers is dysfunctional due to a wordline to bitline short; and providing power to the sense amplifier in the memory standby state.

2. The method of claim 1 further comprising detecting the wordline to bitline short to generate a leakage control signal in the volatile memory.

3. The method of claim 1 further comprising activating connections between others of the bitline arrays and the sense amplifier in the memory access state.

4. The method of claim 1, wherein the memory access state is corresponding to a memory refresh command.

5. The method of claim 1, wherein the memory access state is corresponding to a memory write command.

6. The method of claim 1, wherein the memory access state is corresponding to a memory read command.

7. The method of claim 1, wherein the volatile memory is a dynamic random access memory.

8. A leakage control device for reducing power consumption in a volatile memory having bit line arrays selectively operational in a memory standby state and a memory access state, power suppliers each coupled to a corresponding one of the bit line arrays for providing power to the bit line arrays, and a sense amplifier coupled to the bit line arrays, the leakage control device comprising:

multiple multiplexer controllers, each for deactivating connections between the bitline arrays and the sense amplifiers in the memory standby state;

a local leakage controller for deactivating power supply from one of the power suppliers when one of the bit line arrays corresponding to the one of the power suppliers is dysfunctional due to a wordline to bitline short; and a sense power supplier for providing power to the sense amplifier in the memory standby state.

9. The leakage control device of claim 8 further comprising a detector for detecting the wordline to bitline short to generate a leakage control signal in the volatile memory.

10. The leakage control device of claim 8, wherein others of the multiplexer controllers are further utilized for activating the connections between others of the bitline arrays and the sense amplifier in the memory access state.

11. The leakage control device of claim 8, wherein the memory access state is corresponding to a memory refresh command.

12. The leakage control device of claim 8, wherein the memory access state is corresponding to a memory write command.

13. The leakage control device of claim 8, wherein the memory access state is corresponding to a memory read command.

14. The leakage control device of claim 8, wherein the volatile memory is a dynamic random access memory.

* * * * *